United States Patent [19]
Polonen et al.

[11] Patent Number: 5,293,139
[45] Date of Patent: Mar. 8, 1994

[54] CMOS-COMPANDER

[75] Inventors: Jouni Polonen, Salo; Mika Gronroos, Piispanristi; Kim Kaltiokallio, Salo, all of Finland

[73] Assignee: Nokia Mobile Phones Ltd., Salo, Finland

[21] Appl. No.: 960,960

[22] Filed: Oct. 13, 1992

[30] Foreign Application Priority Data

Oct. 16, 1991 [FI] Finland .................................. 914884

[51] Int. Cl.[5] .................................. H03G 7/06
[52] U.S. Cl. .................................. 333/14; 381/106
[58] Field of Search ................ 330/51, 129, 131, 140, 330/141, 149; 333/14; 381/106

[56] References Cited

U.S. PATENT DOCUMENTS

| | | | |
|---|---|---|---|
| 3,828,262 | 8/1974 | Trocqueme | 328/175 |
| 4,322,579 | 3/1982 | Kleis et al. | 381/106 |
| 4,987,383 | 1/1991 | Mauthe | 330/279 |

FOREIGN PATENT DOCUMENTS

0363714A2  4/1990  European Pat. Off. ...... H03G 9/02

OTHER PUBLICATIONS

IEEE 1990 Custom Integrated Circuits Conference May 13, 1990, Boston, Mass., pp. 12.7.1–12.7.4, XP167690, Kaoru Takasuka, et al., "A Sigma-Delta Based Square-Law Compandor".

*Primary Examiner*—Steven Mottola
*Attorney, Agent, or Firm*—Perman & Green

[57] ABSTRACT

The invention relates to a compressor and an expander for use in a compander realized in CMOS-technology which is used to improve speech quality in mobile phone systems AMPS (NAMPS), NMT and TACS (JTACS, ETACS, NTACS). The compander is integrated with other functions of the mobile phone. The compressor and expander have SC-amplifiers controlled by a control logic. A double comparator XOR-block is used in the control of the amplifiers.

14 Claims, 4 Drawing Sheets

CMOS-COMPANDER

This invention relates to a compressor or an expander for use in a compander.

BACKGROUND OF THE INVENTION

The specifications for mobile phones, except for the NMT450 network in the Nordic countries, require the use of a compander. The compander is used to improve speech quality. The companding reduces noise and different interferences originating in the radio path.

The compander is employed in the audio part of the mobile phone. Present solutions use a compander realized in prior art bipolar technology. A prior art compander comprises two sections, the compressor and the expander. The compressor compresses with a ratio of 1:2 the dynamics of the signal passing through it, and the expander accordingly expands with the ratio of 2:1 the dynamics of the signal passing through it.

FIG. 1 shows the operating principle of a bipolar compander according to prior art. In its IC implementation the compressor 1 and the expander 2 are two substantially identical blocks within the same IC circuit. The basic component blocks are a full wave rectifier 3 and 4, an adjustable amplifier cell 5 and 6, an operational amplifier 7 and 8, and the internal biasing of the circuit. With external components it is possible to realize the functions of either compression or expansion. This takes place by connecting the adjustable amplifier cell 5, 6 and the full wave rectifier 3, 4 either to the feedback chain (compressor) or the input of the amplifier (expander).

FIG. 2 shows the operating principle of a compander, which differs from the generally known compander embodiment and forms the basis when the compander according to the invention is realized.

The compressor section 9 comprises identical amplifier sections 11 and 12 with gain G. The input signal Uin is connected through both amplifier sections 11, 12 to the full wave rectifier block 13 having the input signal level Uref=G*G*Uin. The amplifiers are controlled according to this information so that the desired compression is achieved. The output signal Uout=G*Uin is obtained at the output of the first amplifier 11.

The first amplifier 14 of the expander section 10 is an inverse amplifier of the respective G-amplifier and its gain is 1/G. The input signal Vin is also connected directly to the block 15 operating with gain G. From this block 15 the signal is connected to the full wave rectifier block 16, the rectifier 16 having an output level Uref=G*Uin. According to this information the amplifiers 14 and 15 are controlled so that the desired expansion is obtained. The output signal Uout=1/G*Uin is obtained at the output of the first 1/G-amplifier 14.

The amplifier gain changes until the signal Uref supplied to the full wave rectifier block 13, 16, after a certain response time, reaches a level of constant dynamics. This level is called the ineffective level, the reference level, at which a signal passes through the compressor 9 and the expander 10 with unaltered dynamics. The operating ranges of the compressor and the expander are formed relating to this reference level.

The widely known operating principle shown in FIG. 2 does not stipulate in which way the amplifier control should be realized. It is worth noting that full wave rectification is used to detect the level of the signal to be companded. The amplifier gain is changed according to this level information, so that the desired compression or expansion is obtained. The prior art compander realized in bipolar technology also uses full wave rectification to control the amplification.

U.S. Pat. No. 4,987,383 discloses an integrated compression amplifier that can be constructed in CMOS technology and whose threshold voltages are programmable. The amplifier utilizes switched capacitor amplifiers.

A basic problem is that the prior art compander embodiment poorly suites present mobile phone applications. Due to its encapsulation it requires a large area on the circuit board. It further requires several external components. The main problem of the basic solution described in FIG. 2 is on the other hand how to realize it in practice.

If the compander is realized in CMOS-technology and full wave rectification of the signal is used, there is an alternative in the use of A/D-converters, so that it will be possible to control the controlled amplifiers with which the companding of the payload signal can be realized accurately. The circuitry for the A/D-conversion would be complicated. On the other hand, if a full wave rectified analog signal is used to control the amplifiers, the amplifier realization will be complicated in order to obtain the required linearity and dynamics.

The mobile phone specifications define so-called transient response times for the compressor and the expander, an attack response time tA determined by the sudden increase of the signal, and a return time tR due to the sudden decrease of the signal. These times determine how fast the output of the compressor or the expander will follow changes in the input level. The compressor has a tA of about 3,5 ms and a tR of about 13,5 ms. The expander tA and tR are about 13,5 ms. Realization of these differing transient response times is problematic.

When CMOS-technology is used, and when the smallest possible silicon area is sought after, the amplifiers must be realized as so-called switched capacitor amplifiers, i.e. or SC-amplifiers (Switched Capacitor), which are based on the use of clock controlled capacitors. Then there is a problem to get a correct timing of the sampling of the processed payload signal. The offset voltages and the coupling of different interferences to the payload signal should be minimized.

The mobile phone specifications demand that it must be possible to switch off the compression and expansion functions in some situations, for example in the type approval measurements of the mobile phones. When it is desirable to use the same compander in different mobile phone systems, in AMPS, NMT and in TACS, differing audio line levels in the mobile phone transmission and reception paths will pose a problem. Then it will be inconvenient to switch off the companding or to implement the by-pass mode so that it would be suitable for all systems.

SUMMARY OF THE INVENTION

According to a first aspect of the present invention there is provided a compressor (9, 17) comprising a first controlled amplifier (11), a second controlled amplifier (12), the input of which is connected to the output of the first amplifier (11), the amplifiers (11, 12) being switched capacitor (SC) amplifiers (19, 20), a level detection circuit (13), for detecting the level of the second amplifier (12) output signal and, a control circuit controlling the first (11) and the second (12) amplifiers responsive to the level detection circuit (13), characterized in that the level detection (23) circuit includes means for comparing the detected level of the second amplifier output signal with an upper (+Uref) and a lower (−Uref) reference voltage, the output of the detection circuit (23) having a first value when the detected signal level in the zone is between the reference voltages, and the output of the detection circuit (23) having a second value when the input signal is outside this zone, and the control circuit (25) comprises a counting means in which the counting direction is determined according to the value of the detection circuit (23) output, and in which the counting result which is used to generate a control word for the amplifiers (19, 20).

According to a second aspect of the present invention there is provided an expander (10,18) comprising a first controlled amplifier (11), a second controlled amplifier (12), the input of which is connected to the output of the first amplifier (11), the amplifiers (11, 12) being switched capacitor (SC) amplifiers (19, 20), a level detection circuit (13), for detecting the level of the second amplifier (12) output signal, and a control circuit controlling the first (11) and the second (12) amplifiers responsive to the level detection circuit (13), characterized in that the level detection (23) circuit includes means for comparing the detected level of the second amplifier output signal with an upper (+Uref) and a lower (−Uref) reference voltage, the output of the detection circuit (23) having a first value when the detected signal level in the zone is between the reference voltages, and the output of the detection circuit (23) having a second value when the input signal is outside this zone, and the control circuit (25) comprises a counting means in which the counting direction is determined according to the value of the detection circuit (23) output, and in which the counting result which is used to generate a control word for the amplifiers (19, 20).

The compander incorporating a compressor and expander according to the invention replaces the separate prior art bipolar compander used until now. The compander realized in CMOS-technology is integrated with other audio functions of the mobile phone. The invention is suitable to be used in the mobile phone systems AMPS (NAMPS), NMT and TACS (JTACS, ETACS, NTACS).

BRIEF DESCRIPTION OF THE DRAWINGS

An embodiment of the invention is described in detail below, by way of example, with reference to the accompanying drawings, in which.

DETAILED DESCRIPTION OF THE INVENTION

Figure 1:
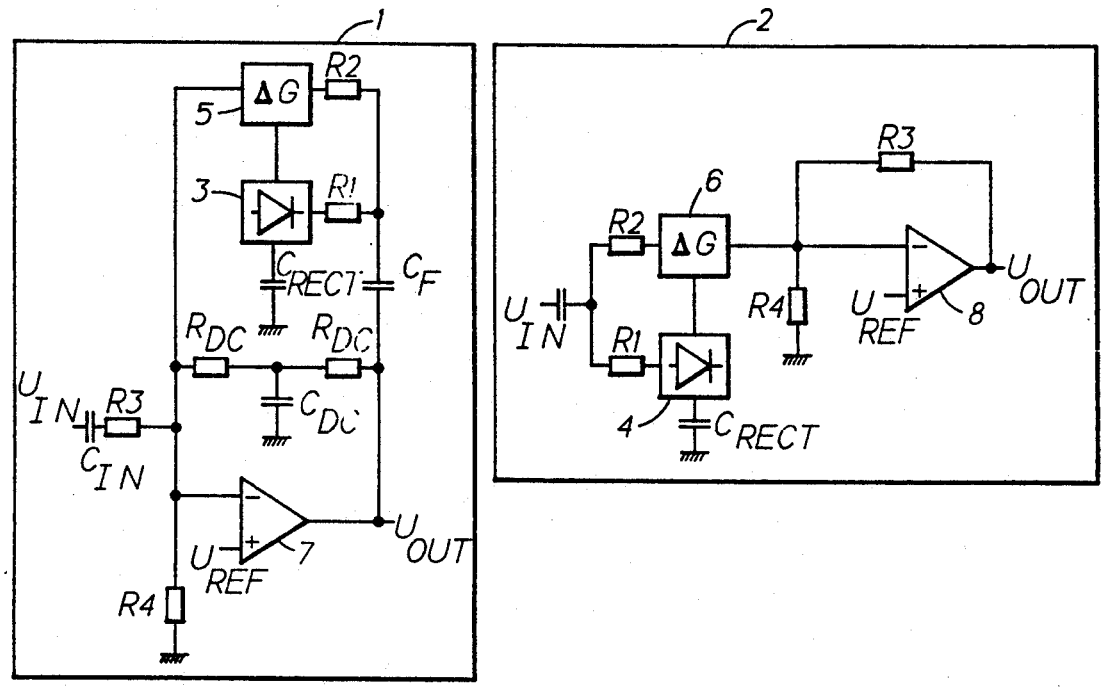
FIG. 1 shows the operating principle of a bipolar compander according to prior art.
Figure 2:
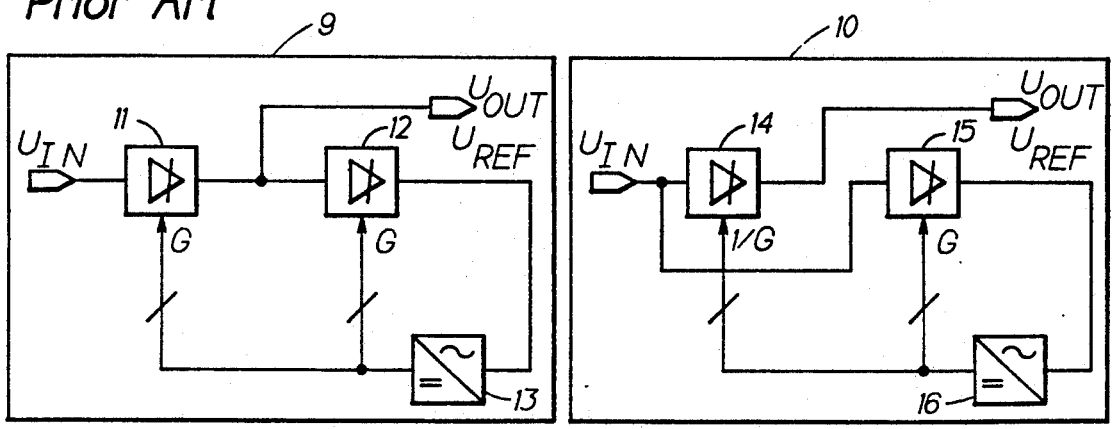
FIG. 2 shows the operating principle of another generally known compander.
Figure 3:
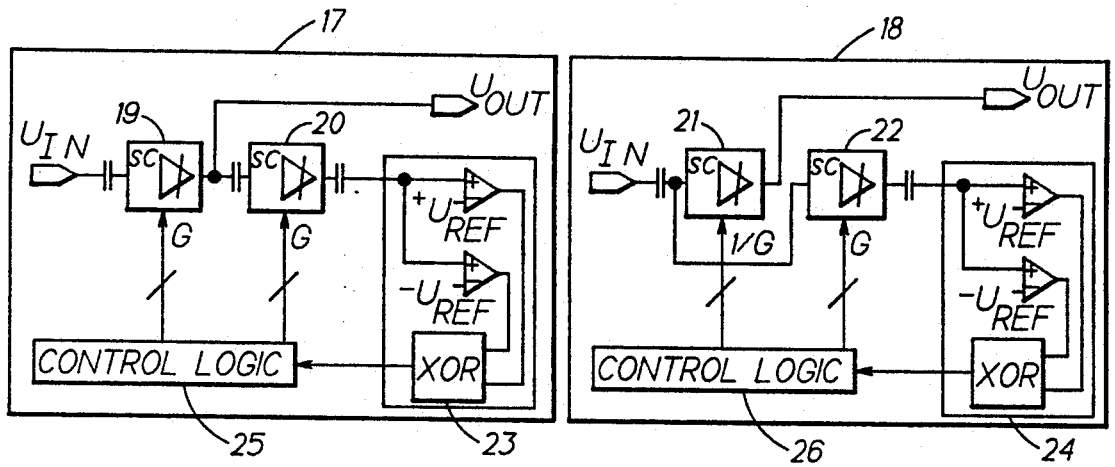
FIG. 3 shows the block diagram of a CMOS-compander according to the invention.

FIG. 3 shows the block diagram of a CMOS-compander according to the invention. The compander comprises the compressor unit 17 and the expander unit 18. The amplifiers of the compander according to the invention are programmable, clock controllable Switched Capacitor amplifiers or SC-amplifiers 19, 20, 21, 22. The essential change compared with the known solution is that the full wave rectification blocks and the amplifier control blocks are replaced using a simple double comparator XOR-block 23, 24, which detects the positive and negative peak values of the signal. The output of the XOR-circuit provides the level information for the control logic 25, 26. A logical level 1 states that the gain must be increased, and a logical level 0 states that the gain must be decreased. The control sections of the compressor 17 and the expander 18 are identical. The compander can be realized in CMOS-technology and integrated with other audio functions of the mobile phone.

The control logic 25, 26 shown in FIG. 3 comprises the amplifier control section and the counting section. The control section further comprises fine tuning and coarse tuning sections. The counting section provides for the decreasing or the increasing of the gain, and for the stopping of counting when the minimum or maximum gain has been reached. The counting section is further responsible for the obtaining of transient response times of correct length.

Figure 4:
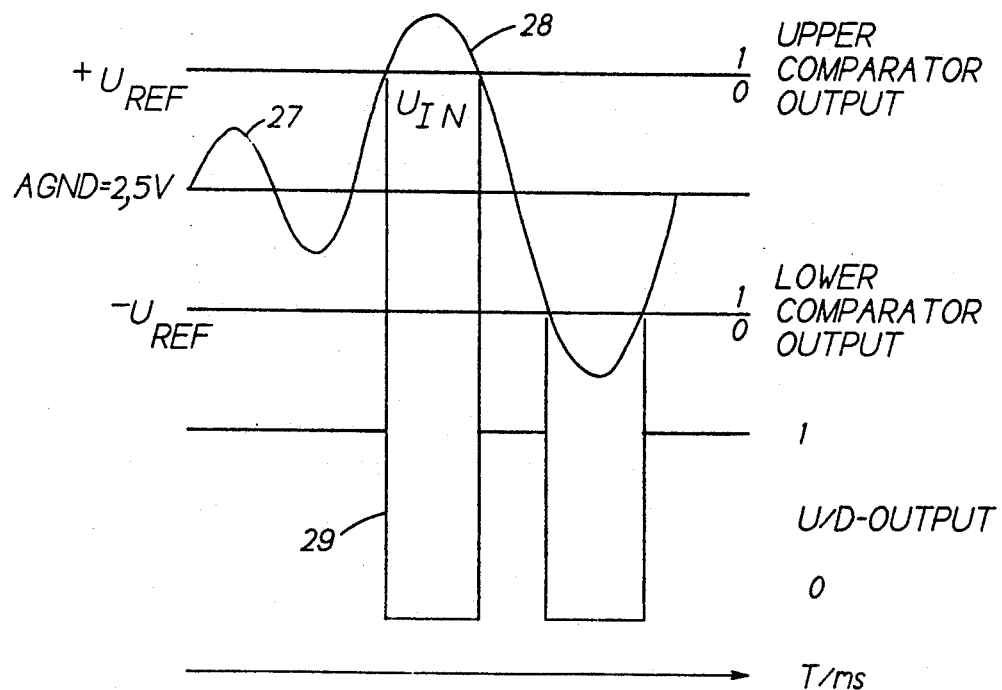
FIG. 4 shows the operation of the comparator section of the control block according to the invention.

FIG. 4 shows the function of the control block 23, 24 according to the invention. The reference voltages +Uref and −Uref must be selected slightly smaller than the peak value of the signal at the desired reference level. Then in a stable counting situation the comparator output provides a standard series of logic level 0 and level 1. FIG. 4 shows two sine wave periods 27, 28 in the comparator input and the behavior of the logic levels 29 in various points of the comparator. When the smaller sine signal 27 arrives in the comparator, then the upper comparator output is a logical 0, the lower comparator output is a logical 1 and the XOR-output 29 is a logic 1. Then the amplifier control logic 25, 26 begins to increase the gain.

If the greater sine signal 28 arriving in the comparator has a positive half period peak which is higher than the positive reference level Uref, the upper comparator output is a logical 1, the lower comparator output a logical 1, and the XOR-output 29 is a logical 0. During the negative peak of the same signal both comparator outputs have the logical state 0 and the XOR-output 29 is a logical 0. Then the amplifier control logic 25, 26 begins to decrease the gain.

Figure 5:
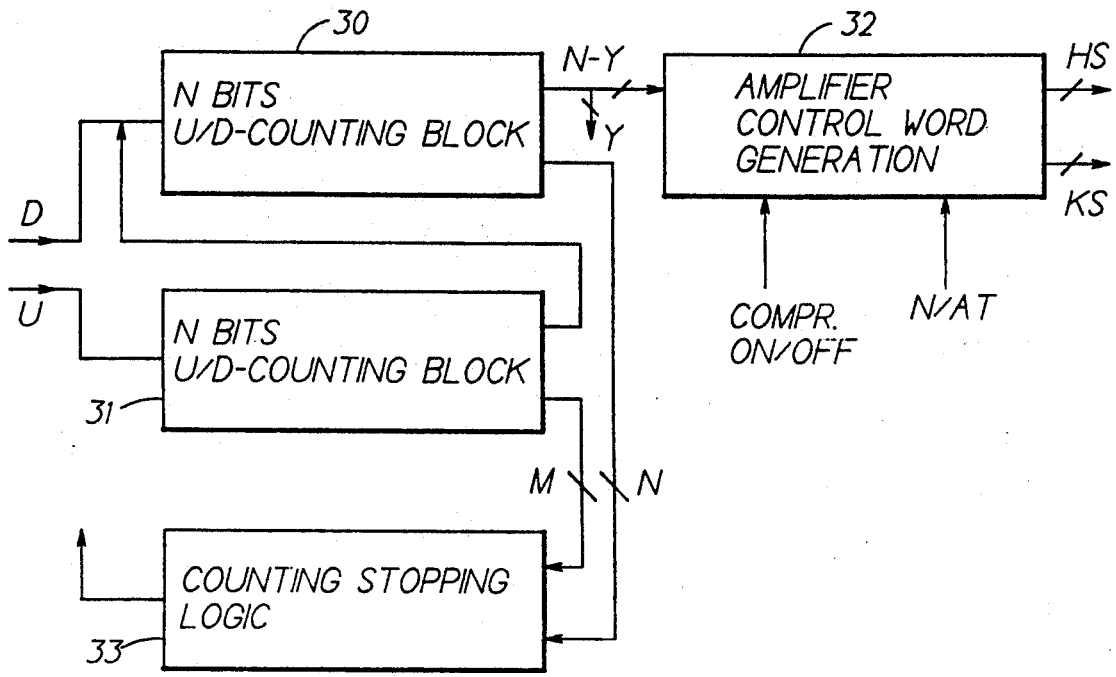
FIG. 5 shows the block diagram of the control section for amplifiers according to the invention.

FIG. 5 shows the block diagram of the amplifier control section 25, 26 according to the invention. The input of the control logic 25, 26 is a logical XOR-level information 1 or 0, according to the direction of the change of the gain. The output information of the control logic 25 and 26 is a control word for the amplifiers 19, 20 and 21, 22 respectively.

The control logic 25, 26 contains an up/down, U/D-counting block 30 counting in both directions and a U-block 31 counting only upwards. These counting blocks 30, 31 count all the time, controlled by a fixed clock frequency. When the gain is increased all counting stages 30, 31 are one after another, or m+n bits. When the gain is decreased, only the U/D-block 30, or n bits is used. The lower counting block 31 is totally by-passed. Transient response times, the attack response time tA and the return time tR, of unequal length are obtained with this method.

The n-y highest bits from the U/D-block 30 are supplied to the amplifier control word generating block 32. The y lowest bits are so-called integrating bits, as are the m bits of the U-block. They do not control the amplifiers 19, 20, 21, 22. When the input signal of the comparators has a constant level, the fluctuation of the XOR-output between the state 1 and the state 0 causes a corresponding fluctuation of the y lowest bits, but the n-y highest bits will not vary. Thus changes in the lowest stages do not influence the amplifier control word. By the use of the extra y bits the amplifier control word can be kept stable. Without this embodiment the output signals of the amplifiers 19, 20, 21, 22 would never be fully stable for an input signal with a constant level.

The control logic also contains a stopping logic 33, which prevents the counting stages to turn around when the gain control word reaches either margin. The number of counting stages depends of their clock frequency. The embodiment uses a clock frequency of 25 kHz, at which the U/D-block contains 10 stages, of which the two lower ones were the so-called extra y-stages. The U-block contained two stages, so that when the gain is increased the response times are four times longer than when the gain is decreased. Thus the required transient response times tA, tR were obtained. The amplifier control word generating block 32 comprises further a fine tuning and a coarse tuning section. These are indicated as buses HS and KS in FIG. 5. The voltage controlled amplifiers 19, 20, 21, 22 of the compander may contain a desired number of fine tuning and coarse tuning controls.

Figure 6:
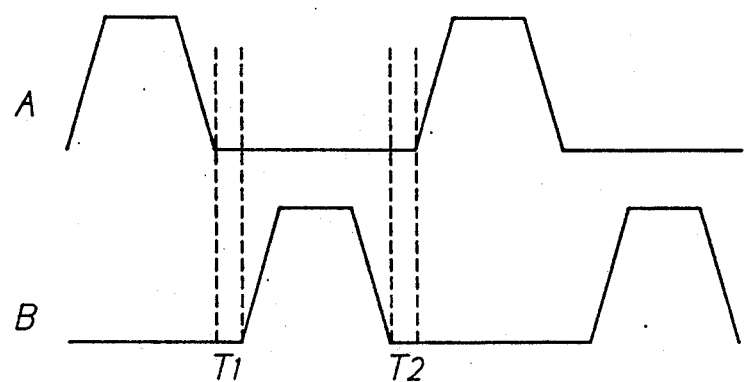
FIG. 6 shows the principle of the so-called non overlapping clock signal used in signal sampling.

FIG. 6 shows the principle of the so-called non overlapping clock signal used in the sampling of signals. The clock signal B is low when the clock signal A leads, and when the clock control is changed there is a short so-called non overlapping time t1, t2 with a length of about 40 ns.

Figure 7:
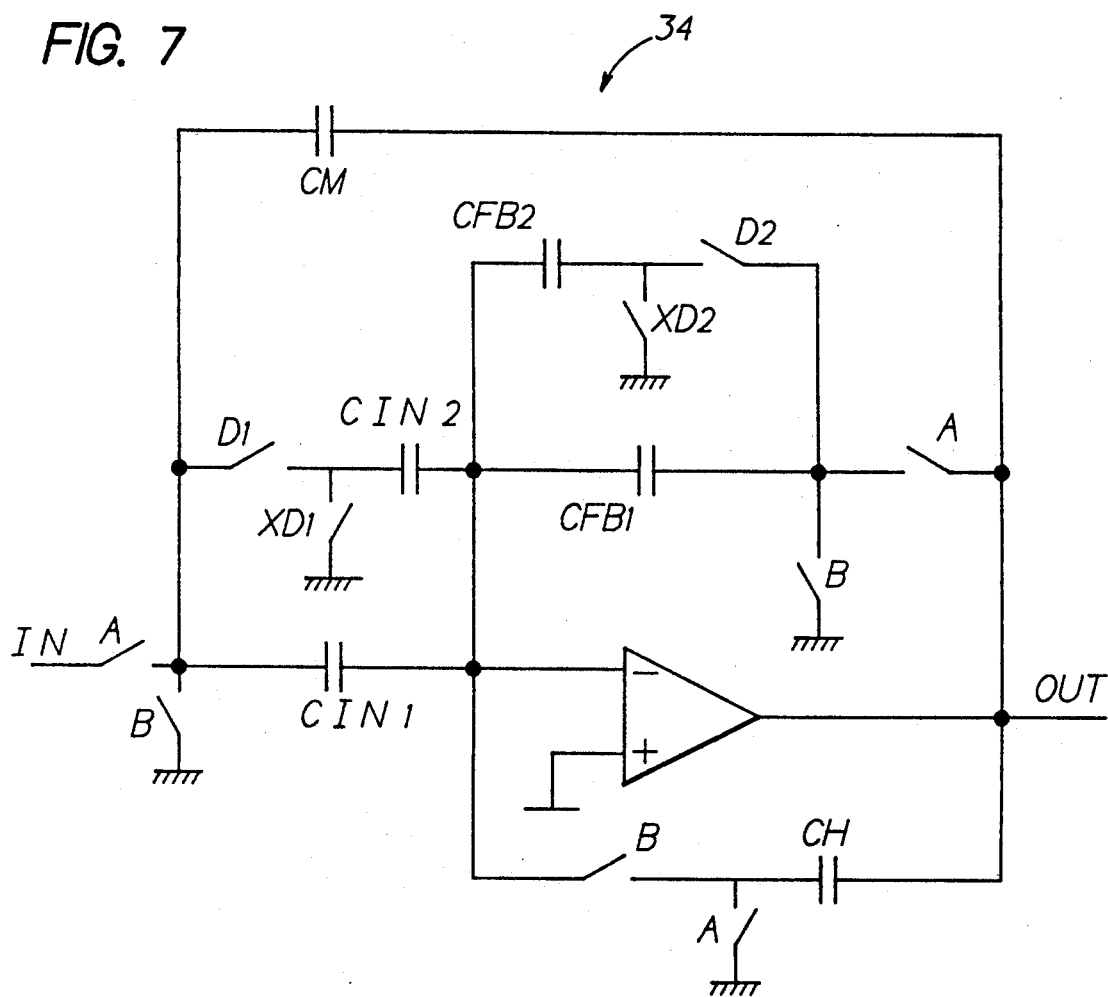
FIG. 7 shows the principle of a programmable SC-amplifier according to the invention.

FIG. 7 shows the principle of the circuit diagram 34 of the programmable SC-amplifier 19, 20, 21, 22 according to the invention. With the bit controls D1 . . . Dn it is possible to connect in parallel with the fixed capacitors Cin1 and Cfb1 a desired number of capacitors, as required. The total gain is AV = −(Cin/Cfb) or the sum of the input capacitors divided by the sum of the feedback capacitors.

In a practical implementation the procedure is such that a sample of the payload signal is supplied to the amplifier input during the clock phase A, which is the sampling phase of both amplifiers 19, 20, 21, 22 of the compressor 17 and the expander 18. During the same clock phase A, a sample of the payload signal is also supplied further from the compressor 17 or from the expander 18 to the following stage. Counting in the control section is performed during the clock phase B. The gain of the programmable amplifiers is also changed during the clock phase B. The only operation in the control section during the clock phase A is to read the comparison result of the comparator. This solution minimizes offset voltages and interferences coupled from the control section to the payload signal.

The realization of the by-pass mode for different mobile phone systems with differing line levels is simply realized by utilizing the amplifier control word generation. AMPS and TACS have equal line levels in the transmission and the reception paths, and NMT has unequal line levels.

When the counting logic of FIG. 5 is stopped, the adjusting controls of the programmable amplifier are not altered anymore, because there is no change of the control word anymore. Then a situation is achieved, where the gain as such is constant, but not the desired gain.

When the amplifier by-pass word generating section is supplied with information of the compander by-pass mode according to FIG. 5, and when the system information selection is N=NMT and AT=AMPS&TACS, it is possible to select fixed control lines from the control word fine tuning and coarse tuning generation with the aid of the distributed logic of the control word generation. From the programmable SC-amplifier these lines further select into parallel with the fixed capacitors Cin1, Cfb1 such capacitors, with which a gain is obtained that in practice is sufficiently close to the desired constant gain.

The mobile phone specifications require for the input signal a minimum operating range, within which the compander sufficiently accurately must retain the companding ratio 1:2. In a compander according to the invention this range is specified as $+20 \ldots -44$ dB related to the ineffective level. Then the dynamics of the compressor output is $+10 \ldots -22$ dB. The operation or the dynamics range of the expander is specified as the opposite.

Continuously operating amplifiers in compander applications have a problem in that it is not possible to get a dynamics exactly as desired of them, but the companded dynamics range in practice is larger than required by the specifications. This is the case with the prior art bipolar compander. In practice this is seen as an inconvenience in the expander, so that during a mobile phone connection there is only the basic noise of the line when the opposite party stops talking. This basic noise level further drops due to the expander. Then a person might perceive the almost soundless line as irritating. There occurs the effect of a broken connection.

Another problem is that the compressor always increases its output level on the transmission path when the signal is lower than the ineffective level. The basic noise level will also increase, and thus an undesirable residual modulation is generated. The prior art bipolar compander also compresses the output level for signals which are below the minimum level required by the specifications. This will unnecessarily increase the residual modulation.

By using the programmable SC-amplifier according to the invention it is possible to define a constant minimum dynamics for the expander, this dynamics conforming exactly to the mobile phone specifications. Then, even during silent speech periods, the line level can drop only to the minimum level allowed by the programmable amplifier. An effect of annoying silence in the speech connection will not occur. Moreover, signal levels below the required minimum dynamics are not longer compressed in a construction including programmable amplifiers according to the invention. Therefore the residual modulation remains lower than in the prior art bipolar compander embodiment.

In view of the foregoing it will be clear to a person skilled in the art that modifications may be incorporated without departing from the scope of the present invention.

We claim:

1. A compressor comprising:
   a first controlled amplifier having signal input and signal output means;
   a second controlled amplifier, the input of which is connected to the output of the first amplifier, the amplifiers being switched capacitor (SC) amplifiers;
   a level detection circuit, for detecting the level of the second amplifier output signal; and
   a control circuit controlling the first and the second amplifiers responsive to the level detection circuit, characterized in that
   the level detection circuit includes means for comparing the detected level of the second amplifier output signal with an upper (+Uref) and a lower (−Uref) reference voltage, the output of the detection circuit having a first value when the detected signal level lies in a zone between the reference voltages, and having a second value when the input signal lies outside the zone between the reference voltages, and
   the control circuit comprises counting means in which the counting direction is determined according to the value of the detection circuit output, and in which the counting result is used to generate a control word for the amplifiers.

2. A compressor as claimed in claim 1, wherein the level detection circuit contains a first and a second comparator, whose first input is supplied with the output signal of the second amplifier and whose second input is supplied with the reference voltage (+Uref, −Uref); and an XOR-circuit, whose inputs are the comparator outputs and whose output is the output value of the detection circuit.

3. A compressor as claimed in claim 1, wherein the control circuit contains a U/D-Counting block counting in both directions and a U-block counting only upwards, the counting blocks being connected so that both blocks are used when counting upwards, and only the U/D-counting block is used when counting downwards; a count stopping logic; and an amplifier control word generating block, to whose input the output of the U/D-counting block is connected.

4. A compressor as claimed in claim 3, wherein the least significant bits are removed from the output signal of the counting block before it is supplied to the amplifier control word generating block.

5. A compressor as claimed in claim 4, wherein the amplifier control word generating block comprises a fine tuning and a coarse tuning control.

6. A compressor as claimed in claim 1, wherein the first and the second amplifiers have connections and a clock, which are realized so that a sample is provided at the output during the same clock phase "A" during which the signal is supplied to the amplifier's input, and that the signal amplification is changed during the opposite clock phase "B".

7. An expander comprising:
   a first controlled amplifier having signal input and signal output means;
   a second controlled amplifier, the input of which is connected to the output of the first amplifier, the amplifiers being switched capacitor (SC) amplifiers;
   a level detection circuit, for detecting the level of the second amplifier output signal; and
   a control circuit controlling the first and the second amplifiers responsive to the level detection circuit, characterized in that
   the level detection circuit includes means for comparing the detected level of the second amplifier output signal with an upper (+Uref) and a lower (−Uref) reference voltage, the output of the detection circuit having a first value when the detected signal level lies in a zone between the reference voltages, and having a second value when the input signal lies outside the zone between the reference voltages, and
   the control circuit comprises counting means in which the counting direction is determined according to the value of the detection circuit output, and in which the counting result is used to generate a control word for the amplifiers.

8. An expander as claimed in claim 7, wherein the level detection circuit contains a first and a second comparator, whose first input is supplied with the output signal of the second amplifier and whose second input is supplied with the reference voltage (−Uref, −Uref), and an XOR-circuit, whose inputs are the comparator outputs and whose output is the output value of the detection circuit.

9. An expander as claimed in claim 7, wherein the control circuit contains a U/D-counting block counting in both directions and a U-block counting only upwards, the counting blocks being connected so that both blocks are used when counting upwards, and only the U/D-counting block is used when counting downwards; a count stopping logic; and an amplifier control word generating block, to whose input the output of the U/D-counting block is connected.

10. An expander as claimed in claim 9, wherein the least significant bits are removed from the output signal of the counting block before it is supplied to the amplifier control word generating block.

11. An expander as claimed in claim 10, wherein the amplifier control word generating block comprises a fine tuning and a coarse tuning control.

12. An expander as claimed in claim 7, wherein the first and the second amplifiers have connections and a clock, which are realized so that a sample is provided at the output during the same clock phase "A" during which the signal is supplied to the amplifier's input, and that the signal amplification is changed during the opposite clock phase "B".

13. A compander having a compressor and an expander, the compressor comprising:
    a first controlled amplifier having signal input and signal output means;
    a second controlled amplifier, the input of which is connected to the output of the first amplifier, the amplifiers being switched capacitor (SC) amplifiers;
    a level detection circuit, for detecting the level of the second amplifier output signal; and
    a control circuit controlling the first and the second amplifiers responsive to the level detection circuit, characterized in that
    the level diction circuit includes means for comparing the detected level of the second amplifier output signal with an upper (+Uref) and a lower (−Uref) reference voltage, the output of the detection circuit having a first value when the detected signal level lies in a zone between the reference voltages, and having a second value when the input signal lies outside the zone between the reference voltages, and the control circuit comprises counting means in which the counting direction is determined according to the value of the detection circuit output, and in which the counting result is used to generate a control word for the amplifiers.

14. A compander having a compressor and an expander, the expander comprising:
- a first controlled amplifier having signal input and signal output means;
- a second controlled amplifier, the input of which is connected to the output of the first amplifier, the amplifiers being switched capacitor (SC) amplifiers;
- a level detection circuit, for detecting the level of the second amplifier output signal; and a control circuit controlling the first and the second amplifiers responsive to the level detection circuit, characterized in that the level detection circuit includes means for comparing the detected level of the second amplifier output signal with an upper (+Uref) and a lower (−Uref) reference voltage, the output of the detection circuit having a first value when the detected signal level lies in a zone between the reference voltages, and having a second value when the input signal lies outside the zone between the reference voltages, and the control circuit comprises counting means in which the counting direction is determined according to the value of the detection circuit output, and in which the counting result is used to generate a control word for the amplifiers.

* * * * *